United States Patent [19]

McMahan et al.

[11] Patent Number: 5,162,672
[45] Date of Patent: Nov. 10, 1992

[54] DATA PROCESSOR HAVING AN OUTPUT TERMINAL WITH SELECTABLE OUTPUT IMPEDANCES

[75] Inventors: Steven C. McMahan, Garland; Kenneth C. Scheuer, Austin; William B. Ledbetter, Jr., Austin; Michael G. Gallup, Austin; James G. Gay, Pflugerville, all of Tex.

[73] Assignee: Motorola, Inc., Schaumburg, Ill.

[21] Appl. No.: 632,901

[22] Filed: Dec. 24, 1990

[51] Int. Cl.$^5$ .............................................. H03K 3/01
[52] U.S. Cl. ................................. 307/443; 307/241; 307/242; 307/264; 307/270; 307/491
[58] Field of Search ............... 307/264, 490, 493, 491, 307/443, 241, 242, 270

[56] References Cited

U.S. PATENT DOCUMENTS

| | | | |
|---|---|---|---|
| 3,435,375 | 3/1969 | Miller, Jr. | 307/241 X |
| 3,854,057 | 12/1974 | Williams et al. | 307/241 X |
| 4,567,385 | 1/1986 | Falater et al. | 307/242 X |
| 4,695,740 | 9/1987 | Carter | 307/242 |
| 4,791,322 | 12/1988 | Graham et al. | 307/443 X |
| 4,806,802 | 2/1989 | Okitaka et al. | 307/443 X |
| 4,839,537 | 6/1989 | Ueno | 307/443 X |
| 4,853,560 | 8/1989 | Iwamura et al. | 307/264 X |
| 4,975,598 | 12/1990 | Borkar | 307/443 |
| 5,063,308 | 11/1991 | Borkar | 307/443 |

Primary Examiner—Eugene R. LaRoche
Assistant Examiner—Do Hyun Yoo
Attorney, Agent, or Firm—Robert L. King

[57] ABSTRACT

A data processor has at least one output terminal which a user of the data processor can vary the output impedance thereof depending upon the application environment of the data processor. A first output buffer of an output buffer stage has a predetermined output impedance and is coupled between an input of the stage and the output terminal. The first output buffer provides a first output terminal impedance. A second output buffer having a lower output impedance then the first output buffer may be selectively coupled in parallel to the first output buffer to reduce the output impedance of the output terminal. The coupling of the output buffers is controlled by a user of the data processor who provides a control input for selecting one of a plurality of predetermined output terminal impedance values.

13 Claims, 3 Drawing Sheets

DATA PROCESSOR HAVING AN OUTPUT TERMINAL WITH SELECTABLE OUTPUT IMPEDANCES

FIELD OF THE INVENTION

This invention relates generally to data processors, and more particularly, to output impedances of output terminals of data processors.

BACKGROUND OF THE INVENTION

Data processors are frequently used in two types of operating applications. A first operating application is a use in a high-performance, zero-wait state system. In a high-performance system, output buffers which have a very fast slew rate are used at output terminals. In a printed circuit board to which data processors are commonly connected, bus lines are terminated to a reference potential to control conventional ringing effects. High-performance terminated lines require interfacing with an output buffer having a low output impedance, such as ten ohms or less. Output buffers having such low impedance require transistors with large physical dimensions in order to achieve proper logic levels. A terminated line has the disadvantages of additional components and circuit area and increased power consumption. A second operating application is a use in a mid-performance, lower cost system. In the mid-performance system, output buffers with slower slew rates may be implemented and may be used with non-terminated lines on a printed circuit board. An output buffer for a non-terminated line typically requires a higher impedance to avoid conventional line ringing. Data processors which use output buffers for non-terminated line applications are less costly to implement in part because transistors having smaller dimensions may be used.

Data processors have typically tried to satisfy both types of output impedance requirements in order to be satisfactory for either high-performance or mid-performance applications. In order to be applicable for both terminated line and non-terminated line applications, a data processor having an output driver circuit with a fixed output terminal impedance somewhere between low and high impedance application values has been implemented. Examples of such data processors are the commercially available MC68020 and the MC68030 data processors offered by Motorola Inc.

SUMMARY OF THE INVENTION

The previously mentioned needs are fulfilled with the present invention. There is provided herein a data processor having an output terminal with selectable output impedances. A plurality of output buffer circuits are selectively coupled in parallel between a buffer input terminal and the data processor output terminal in response to a control signal. Each output buffer circuit has a predetermined buffer output impedance. The control signal has a value controlled by a user of the data processor. The user is able to select predetermined discrete, non-varying output terminal impedances of the data processor by controlling the value of the control signal.

DESCRIPTION OF A PREFERRED EMBODIMENT

Data processors are operating at ever-increasing frequencies. At higher operating frequencies, the time required for a valid logic level transition is beginning to approach the amount of time required for a voltage waveform to travel thru a typical printed circuit board conductor. As a result, data processor timing specification delays are no longer large enough so that printed circuit board propagation delays are insignificant. Therefore, data processor timing specifications are no longer large enough to guarantee that there is sufficient time for intrinsic buffer switching delays and circuit board level propagation delays. Also, as transistor device sizes are increasingly made smaller, the timing constraints for data buses are also reduced and output buffer edge rates are sped up. At higher edge rates, the loads which output buffers drive begin to approximate transmission line characteristics. As a result, a conductor connected to an output terminal of a data processor will not change voltage value equally with respect to time. Since the load of an output buffer of a data processor approximates a transmission line at high frequencies, a reflection may occur at the end of the line which may result in ringing and a significant reduction in noise margin. Therefore, a proper impedance value of an output driver circuit of a data processor will prevent undesired reflections of a voltage waveform provided at the output of the data processor.

Figure 1A:
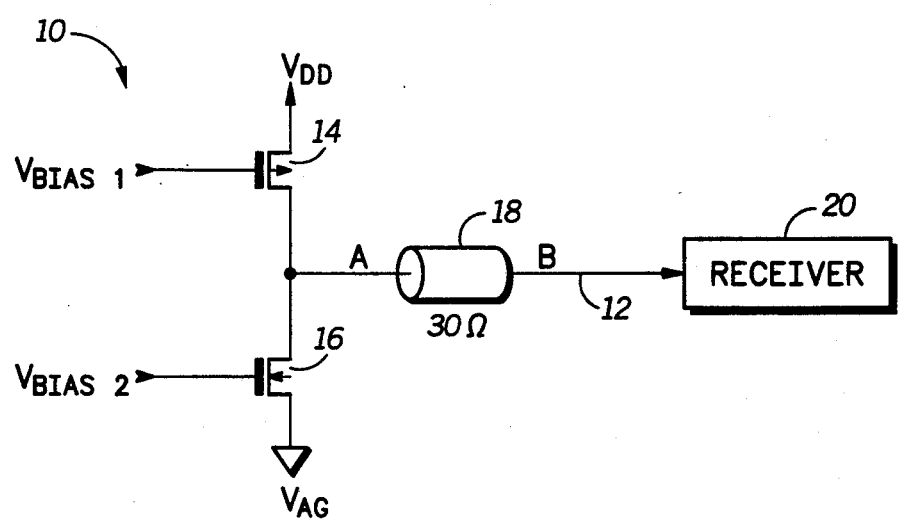
FIG. 1(A) illustrates in schematic form a known buffer circuit for use with an open ended transmission line.

Shown in FIG. 1(A) is a schematic of an output buffer 10 connected to a transmission line having a non-terminated portion 12. Output buffer 10 is for use in a mid-performance data processor. A P-channel transistor 14 has a source connected to a positive power supply voltage, $V_{DD}$, a gate connected to a first bias voltage, $V_{Bias\ 1}$, and a drain connected to a drain of an N-channel transistor 16 at a point labeled "A." Point A may be considered as an output pin of a data processor. A gate of transistor 16 is connected to a second bias voltage, $V_{Bias\ 2}$, and a source of transistor 16 is connected to an analog ground reference terminal labeled "$V_{AG}$." The drain of transistor 14 provides an output voltage and is connected to a thirty-ohm transmission line 18 and is unterminated at a point labeled "B." Point B may be considered as a destination point at the end of the transmission line. A receiver 20 has an input connected to the transmission line at point B for receiving the output voltage of output buffer 10.

Figure 1B:
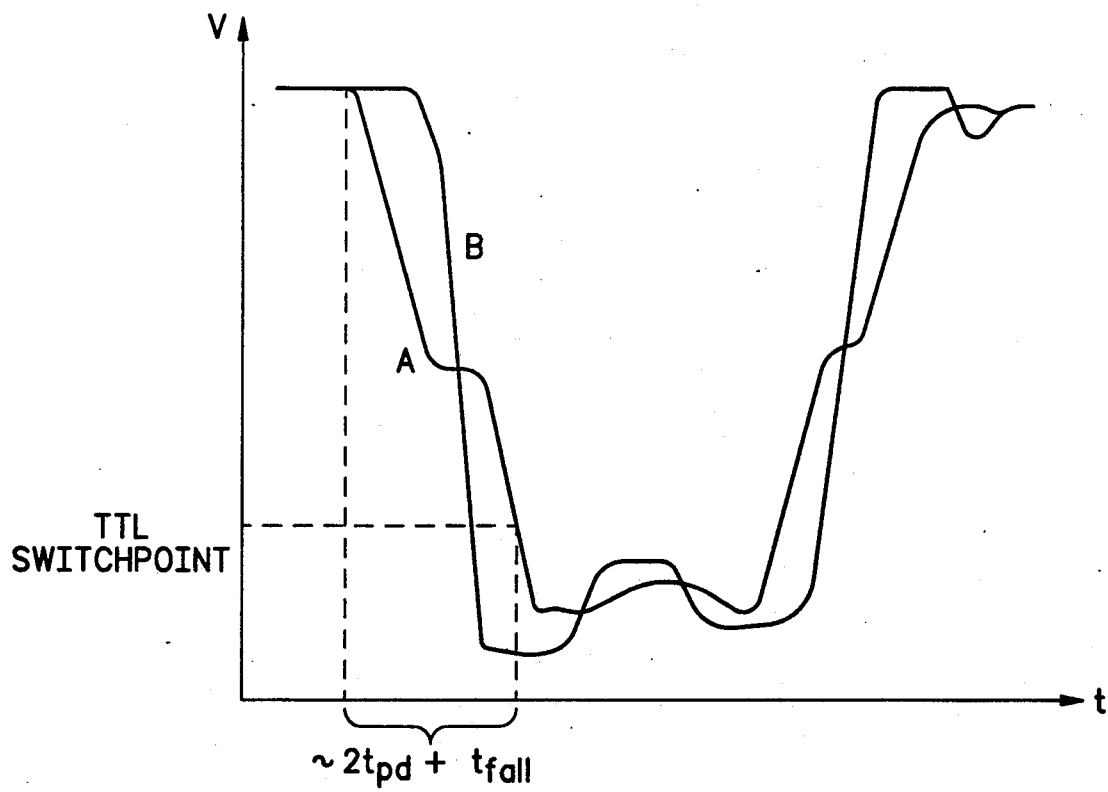
FIG. 1(B) illustrates in graphical form voltage variation with respect to time at two points of the transmission line of FIG. 1(A).

In operation, output buffer 10 functions to switch between two logic levels in response to the first and second bias voltages. However, due to the transmission line characteristics of a transmission line with the non-terminated portion 12, the transition between logic levels of the output voltage of buffer 10 varies depending upon whether the voltage is viewed at point A or point B. Referring to FIG. 1(B), the voltage at both point A and point B is compared in response to the bias voltages functioning to cause the output voltage of buffer 10 to transition from a logic high to a logic low. It should be noted that although the output voltage at point A begins to fall before the voltage at point B begins to transition, the voltage at point B actually crosses a transistor-transistor logic (TTL) switchpoint threshold before the voltage at point A does. The delay associated with the voltage at point A is due to a reflection component of the signal thru transmission line 18 due to the non-terminated portion 12. The delay between the point in time when the voltage at point A begins to fall and the point in time when the TTL switchpoint is reached at point A may be expressed as $(2t_{pd}+t_{fall})$ where "$t_{pd}$" is the propagation delay of line 18 (i.e., the time required for a signal to propagate from point A to point B) and "$t_{fall}$" is the time required for a signal to transition from a logic high to a logic low without any propagation delay. The delay in the transition of voltage at point A may be a significant problem at high operating frequencies.

Figure 2A:
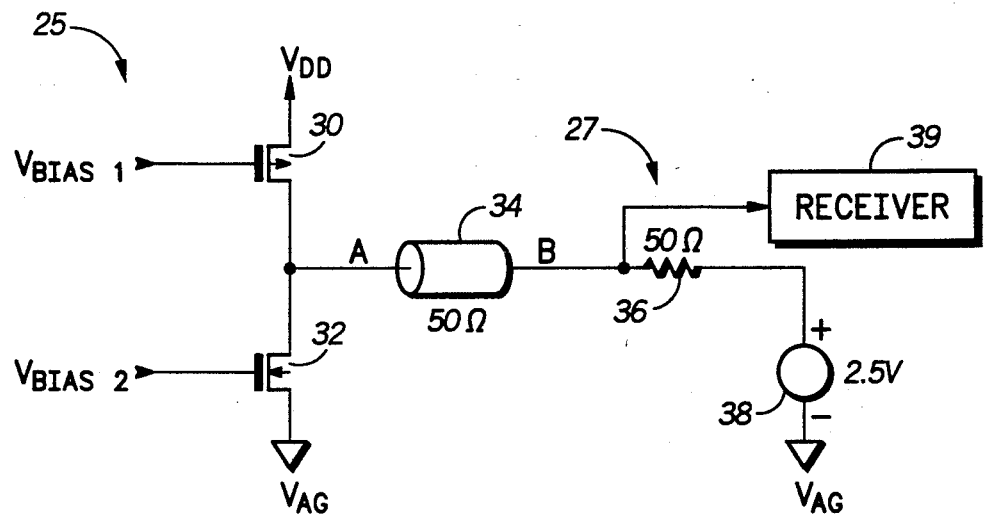
FIG. 2(A) illustrates in schematic form a known buffer circuit for use with a terminated transmission line.

Shown in FIG. 2(A) is a schematic of an output buffer 25 connected to a transmission line having a terminated portion 27. Output buffer 25 is for use in a high-performance data processor application. A P-channel transistor 30 has a source connected to a positive power supply voltage, $V_{DD}$, a gate connected to a first bias voltage, $V_{Bias\ 1}$, and a drain connected to a drain of an N-channel transistor 32 at a point labeled "A." A gate of transistor 32 is connected to a second bias voltage, $V_{Bias\ 2}$, and a source of transistor 32 is connected to an analog ground reference terminal labeled "$V_{AG}$." The drain of transistor 30 provides an output voltage and is connected to a fifty-ohm transmission line 34 and is terminated at a point labeled "B." Point B is terminated by connecting a fifty ohm resistance 36 in series with a power supply 38 providing a voltage which is approximately one-half the voltage of a data processor system supply voltage between point B and the analog ground reference terminal. For example, when a five volt system supply voltage is used, power supply 38 is two and one-half volts. A receiver 39 has an input connected to point B for receiving the output voltage of output buffer 25.

Figure 2B:
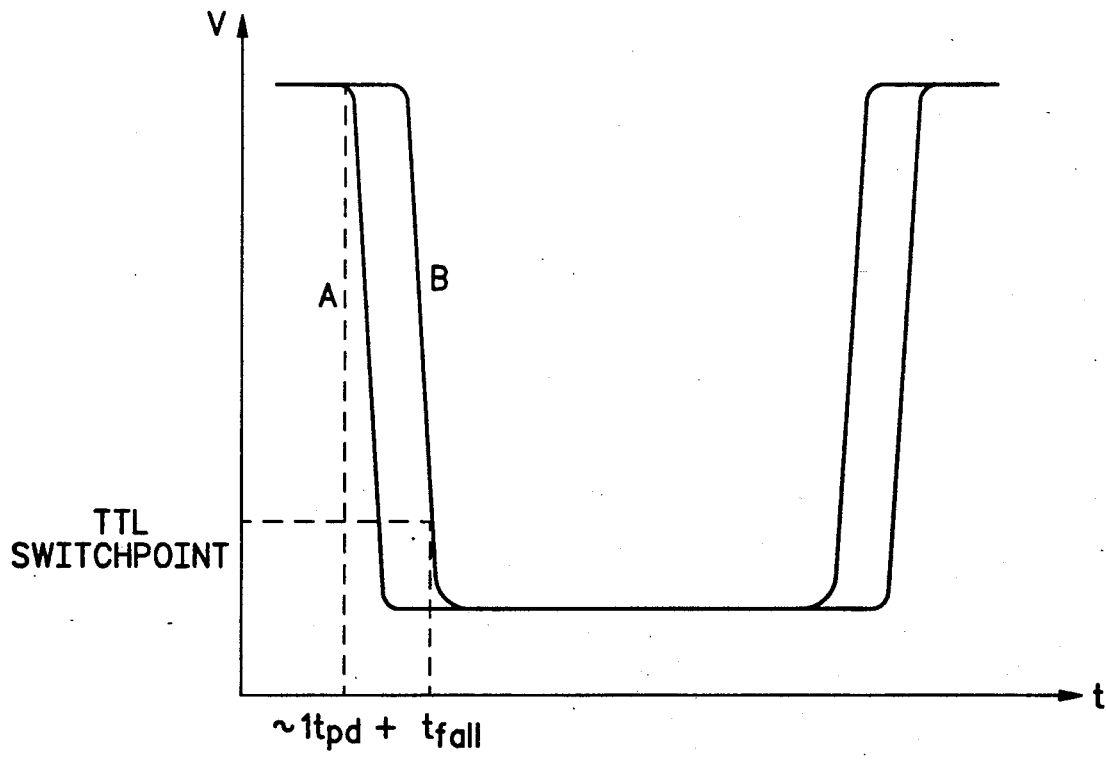
FIG. 2(B) illustrates in graphical form voltage variation with respect to time at two points of the transmission line of FIG. 2(A).

In operation, output buffer 25 also functions to switch between two logic levels in response to the first and second bias voltages. As with buffer 10 of FIG. 1(A), the transition between logic levels of the output voltage of buffer 25 varies depending upon whether the voltage is being viewed at point A or point B. Referring to FIG. 2(B), the voltage at both point A and point B is compared in response to the bias voltages functioning to cause the output voltage of buffer 25 to transition from a logic high to a logic low. It should be noted that with a terminated transmission line, the output voltage at point A begins to fall before the voltage at point B begins to transition. Because the output of buffer 25 is connected to a terminated line, the voltage at point A crosses the same transistor-transistor logic (TTL) switchpoint threshold as in FIG. 2(A) before the voltage at point B crosses the TTL switchpoint threshold. Unlike buffer 10, there is not a large component reflected signal transmitted thru transmission line 34 to interfere with the transition of the output signal at point A. The amount of time delay in reaching the TTL switchpoint between points A and B is approximately $(t_{pd}+t_{fall})$. Therefore, output buffer 25 is significantly faster than output buffer 10. However, the speed enhancement is costly in that the additional components of resistance 36 and power supply 38 are required. Also, resistance 36 and power supply 38 conduct current thru transmission line 34 and create additional power consumption. Therefore, there are trade-offs regarding power consumption and cost to be balanced when choosing between high- and low-performance applications. In the high-performance application, an output buffer having an impedance at the output pin of a data processor which is significantly lower than the impedance at the output pin of a data processor in a mid-performance system is required. A high-performance application using a terminated line requires a low output impedance in order to obtain proper logic levels at the output. A lower cost, non-terminated line application requires a higher impedance to avoid unacceptable line ringing.

Figure 3:
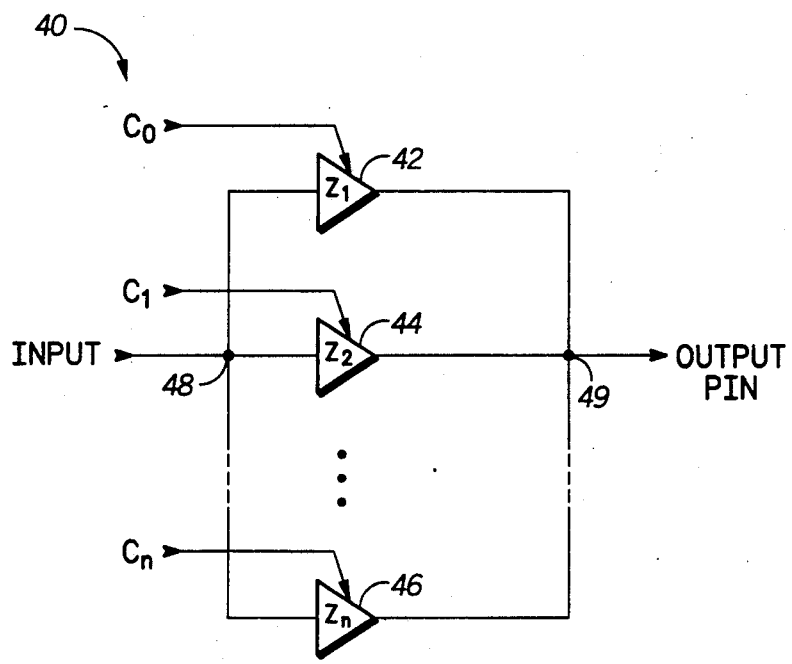
FIG. 3 illustrates in block diagram form a portion of a data processor having a selectable impedance output terminal in accordance with the present invention.

Shown in FIG. 3 is an output buffer section 40 of a data processor having an output terminal with selectable impedance values in accordance with the present invention. Output buffer section 40 generally comprises a plurality of n output buffers, such as buffers 42, 44, and 46. As illustrated, "n" is an integer. Buffers 42, 44, and 46 respectively have a first output impedance value Z1, a second output impedance value Z2, and a third output impedance value Zn. Each of the plurality of buffers has an input connected to an input at a node 48, and each buffer has an output connected to an output terminal at a node 49. The input at node 48 may either be a data input, an address input, or a control input. In the illustrated form, the output terminal is an output pin of a data processor. Each of buffers 42, 44, and 46 also has a control input for respectively receiving control signals C0, C1 and Cn.

In operation, output buffer section 40 functions to provide a collective output buffer at the output pin wherein the collective output buffer has an output impedance which is selectable in response to control signals C0, C1, and Cn. By choosing differing values of Z1, Z2 ... Zn, the output impedance at the output pin may be significantly varied. For example, should a high impedance output pin be needed in a mid-performance application, a single buffer may be coupled between nodes 48 and 49 and all other buffers left unconnected. In one form, control signals C0, C1, and Cn respectively function to couple each of buffers 42, 44, and 46 to the output pin by controlling a coupling transistor within each of the buffers to couple the output of the buffer to the output pin. Each of buffers 42, 44, and 46 may be implemented with any type of known buffer circuit structure, including the buffer structure illustrated in each of FIGS. 1(A) and 2(A). In a high-performance application, control signals C0, C1, and Cn may be used to respectively couple buffers 42, 44, and 46 between nodes 48 and 49. By implementing buffers 42, 44, and 46 with a variety of differing impedance values, differing parallel connected combinations of buffers 42, 44, and 46 will result in differing impedances at node 49. For example, if Z1 is a relatively large valued impedance, such as fifty ohms, and Z2 is a much smaller valued impedance, such as four ohms, an output impedance which varies between approximately four and fifty ohms may be readily implemented in direct response to control signals C0 thru Cn. In the simplest form, the present invention may be implemented by using only two buffer circuits.

Figure 4:
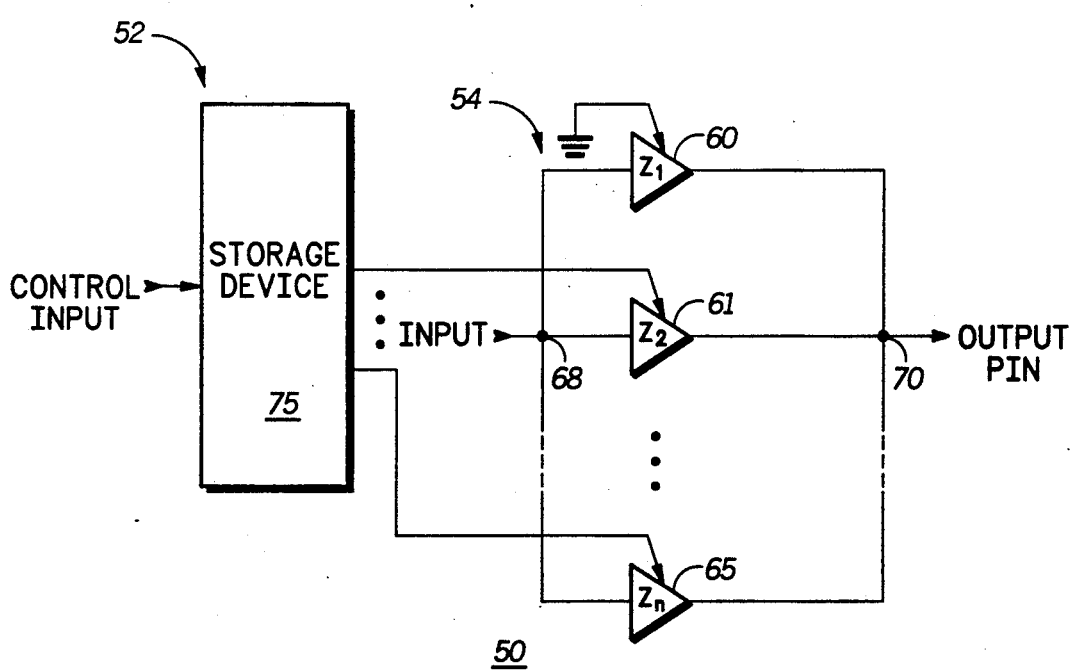
FIG. 4 illustrates in block diagram form a portion of a data processor having a selectable impedance output terminal in accordance with another form of the present invention.

Illustrated in FIG. 4 is an output buffer section 50 generally having a control portion 52 and a buffer portion 54. Within buffer portion 54 is a plurality of n buffer circuits such as buffer circuits 60, 61, and 65. Each of buffer circuits 60, 61, and 65 has an input connected to an input terminal labeled "Input" at a node 68 for receiving either data, control or address information. Each of buffer circuits 60, 61, and 65 has an output connected to an output pin at a node 70. Each of buffer circuits 60, 61, and 65 has a control input terminal for receiving a control signal. The control input of buffer circuit 60 is connected to a ground logic zero reference terminal. Within control portion 52 is a storage device 75 having an input for receiving an input control signal labeled "Control Input". In the illustrated form, storage device 75 has (n−1) control outputs. Each control output of storage device 75 is connected to a control input terminal of a predetermined one of the buffer circuits of buffer portion 54.

In operation, output buffer section 50 receives a control input for selecting the output impedance at node 70. The control input may be generated from any one of numerous sources. For example, the control input may be derived from another input pin of the data processor. In one form, storage device 75 may be a register which receives scanned in impedance selection control data during a predetermined time period in the operation of the data processor. As a result, there is complete user control of the output impedance of predetermined pins of a data processor for application flexibility. Further, the ability to user-control the impedance or drive capability of each data processor pin is independent of other output pins of the data processor. Output buffer section 50 has a predetermined maximum value of output impedance as established by buffer circuit 60 with impedance Z1. Storage device 75 generates control signals for buffers 61 and 65 and any intervening buffers. The control signals selectively connect either none, one, or a plurality of the buffer circuits between nodes 68 and 70 for the purpose of reducing the output impedance at node 70. The input signal connected to node 68 may then be buffered by buffer 60 and any additional selected buffers to provide an output signal having propagation delay characteristics specifically tailored for a predetermined application. In one form of operation, the data processor may be reset to cause storage device 75 to generate control signals which make output buffer section 50 default to a predetermined output impedance.

Specific impedance values for buffers 60, 61, and 65 may be calculated to provide a variety of predetermined output impedances. When selecting predetermined impedance values, it should be remembered that the output impedance of transistors used in the output buffers is nonlinear and these impedances are to be measured at differing source/drain or emitter/collector voltages. Therefore, the calculation of impedance values for each buffer circuit to obtain a predetermined output impedance is also a nonlinear calculation. As an example of one form of the present invention wherein only two buffer circuits are implemented, a low buffer impedance value and a significantly higher valued impedance may respectively be used to provide user selection of an output terminal impedance for either a high-performance application or a low-performance application.

By now it should be apparent that there has been provided a data processor having user controlled output buffer impedance selection. The present invention may be implemented using any type of buffer circuit in connection with a control device which functions to functionally couple the buffer circuit between an input terminal and an output terminal. The storage device 75 illustrated in FIG. 4 may be implemented for example as either a one-of-N decoder, by a PLA, or by a memory circuit such as a ROM. The control input for storage device 75 may be implemented by conventional mask selection or by use of a data processor instruction. The data processor instruction which controls the output terminal impedance selection may be provided either as an instruction from an external source or may be generated internally in response to a predetermined input. The present invention provides an efficient method for implementing a single data processor which may be used in a variety of applications requiring differing output impedance values. No additional integrated circuit pin is required as the user selection may be easily multiplexed with the function of an existing pin of the data processor.

While there have been described herein the principles of the invention, it is to be clearly understood to those skilled in the art that this description is made only by way of example and not as a limitation to the scope of the invention. For example, although the present invention is illustrated as in FIGS. 3 and 4 as using at least three buffer circuits to selectively vary the output impedance of an output terminal, as few as two buffer circuits may be implemented. Although the control signals, C0, C1, ... Cn, are illustrated as distinct signals, a single control signal may be used where C0, C1, etc. represent one or more bits of the single control signal. Accordingly, it is intended, by the appended claims, to cover all modifications of the invention which fall within the true spirit and scope of the invention.

We claim:

1. A data processor having an output terminal, comprising:
a plurality of output buffer circuits, each output buffer circuit having a predetermined buffer output impedance and being coupled in parallel by having a first input connected to a buffer information input terminal, an output connected to the data processor output terminal, and a second input for receiving a control signal having a value which is controlled and may be varied by a user of the data processor, said user being able to select predetermined discrete, output terminal impedances of the data processor by controlling the value of the control signal.

2. The data processor of claim 1 wherein the plurality of output buffer circuits coupled in parallel comprise two output buffer circuits coupled in parallel.

3. The data processor of claim 1 further comprising:
storage means coupled to at least one of the output buffer circuits for providing the control signal for selectively biasing at least a first of the output buffer circuits with same logic values as a second of the output buffer circuits.

4. The data processor of claim 3 wherein the storage means is a register circuit having an input coupled to an input terminal of the data processor.

5. The data processor of claim 1 wherein the control signal is derived from a data processor instruction.

6. In a data processor having an output terminal, a method for selecting an output impedance of the output terminal, comprising the steps of:

providing a plurality of output buffer circuits, each output buffer circuit having a predetermined buffer output impedance;

connecting a first input of each of the output buffer circuits to an information input terminal, connecting an output of each of the output buffer circuits to the output terminal, and providing a second input for each of the output buffer circuits for receiving a control signal; and allowing a user of the data processor to select a value of the control signal to permit the user of the data processor to select one of a plurality of predetermined discrete, output impedance values for the output terminal, the user being able to change the output impedance of the output terminal from a first substantially constant impedance to a second substantially constant impedance by modifying the value of the control signal.

7. The method of claim 6 wherein the step of providing the plurality of output buffer circuits further comprises providing two output buffer circuits having substantially different values of buffer output impedance.

8. The method of claim 6 further comprising the step of:

providing an additional output buffer circuit having a first input terminal connected to the information input terminal, a second input terminal connected to a reference voltage, and an output connected to the output terminal.

9. The method of claim 6 further comprising the step of:

storing the control signal in a storage device before coupling the control signal to the second input of each of the plurality of output buffer circuits.

10. The method of claim 6 wherein the step of selecting the value of the control signal further comprises receiving a data processor instruction to form the control signal therefrom.

11. A data processor having an output terminal, comprising:

a first output buffer circuit having a first input connected to a first node of the data processor for receiving a signal to be buffered prior to being provided as an output, a second input connected to a reference voltage terminal, and an output connected to the output terminal, the first output buffer circuit having a first predetermined impedance;

a second output buffer circuit having a first input connected to the first node of the data processor for also receiving the signal to be buffered prior to being provided as an output, a second input for receiving an impedance selection signal, and an output connected to the output terminal, the second output buffer circuit having a second predetermined impedance which is less than the first predetermined impedance; and means for receiving a predetermined input provided by a user of the data processor to provide the impedance selection signal to the second output buffer circuit, the user of the data processor varying output impedance at the output terminal of the data processor by the predetermined input.

12. The data processor of claim 11 wherein the impedance selection signal is a single bit control signal.

13. The data processor of claim 11 wherein the impedance selection signal is provided in response to receiving a data processing instruction as the predetermined input.

* * * * *